(12) United States Patent
Shoki

(10) Patent No.: US 6,797,368 B2
(45) Date of Patent: Sep. 28, 2004

(54) REFLECTIVE-TYPE MASK BLANK FOR EXPOSURE, METHOD OF PRODUCING THE SAME, AND REFLECTIVE-TYPE MASK FOR EXPOSURE

(75) Inventor: Tsutomu Shoki, Tama (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/373,104

(22) Filed: Feb. 26, 2003

(65) Prior Publication Data

US 2003/0162005 A1 Aug. 28, 2003

(30) Foreign Application Priority Data

Feb. 28, 2002 (JP) ........................ 2002-054714

(51) Int. Cl.[7] .............. B32B 7/02; B32B 9/04; G03F 9/00
(52) U.S. Cl. .............. 428/212; 428/192; 428/446; 428/448; 428/450; 428/699; 430/5
(58) Field of Search .................. 428/212, 432, 428/472.1, 446, 450, 448; 430/5; 378/38

(56) References Cited

U.S. PATENT DOCUMENTS 5,304,437 A * 4/1994 Tennant .................... 430/5
6,522,717 B1 * 2/2003 Murakami et al. ........... 378/43

FOREIGN PATENT DOCUMENTS

| JP | 02-116038 | * 4/1990 | ........ G11B/7/24 |
| JP | 7-333829 | 12/1995 | |
| JP | 8-213303 | 8/1996 | |
| JP | 8-293450 | 11/1996 | |

* cited by examiner

Primary Examiner—Deborah Jones
Assistant Examiner—G. Blackwell-Rudasill
(74) Attorney, Agent, or Firm—Sughrue Mion, PLLC

(57) ABSTRACT

A reflective-type mask blank for exposure comprises a substrate (11), a reflective multilayer film (12) formed on the substrate for reflecting light, and an absorber film (14) formed on the reflective multilayer film. A protection layer (15) is formed on side surfaces of the reflective multilayer film.

10 Claims, 3 Drawing Sheets

REFLECTIVE-TYPE MASK BLANK FOR EXPOSURE, METHOD OF PRODUCING THE SAME, AND REFLECTIVE-TYPE MASK FOR EXPOSURE

BACKGROUND OF THE INVENTION

This invention relates to an exposure technique used in pattern transfer in a semiconductor process and, in particular, to a reflective-type mask blank for exposure, a method of producing the same, and a reflective-type mask for exposure.

In the semiconductor industry, a pattern transfer technique capable of transferring much finer patterns is required following the development of a semiconductor device more and more miniaturized. As the pattern transfer technique of the type, attention is recently directed to an EUV (Extreme Ultra Violet) lithography which is an exposure technique using EUV light having a shorter wavelength. It is noted here that the EUV light is a radiation having a wavelength within a soft X-ray region or a vacuum ultraviolet region, specifically, a wavelength within a range between about 0.2 and 100 nm.

As a mask used in the EUV lithography, proposal is made of a reflective-type mask disclosed, for example, in Japanese Unexamined Patent Publications Nos. H08-213303 (JP 8-213303 A) and H07-333829 (JP 7-333829 A). Referring to FIG. 1, the reflective-type mask comprises a substrate 1, a reflective multilayer film 2 formed on the substrate 1 for reflecting light, an intermediate layer pattern 3 formed on the reflective multilayer film 2, and an absorber pattern 4 formed on the intermediate layer pattern 3 for absorbing light.

In an exposure apparatus, light incident to the reflective-type mask is partially absorbed in an area where the absorber pattern 4 is present and is partially reflected by the reflective multilayer film 2 in a remaining area where the absorber pattern 4 is not present. The former area and the latter area may be referred to as an absorption region and a reflection region, respectively. A reflected image formed by the light reflected by the reflective multilayer film 2 is transferred through a reflection optical system onto a wafer. It is noted here that the intermediate layer pattern 3 of the mask used as described above is not yet formed but an intermediate layer without any pattern covers and protects the reflective multilayer film when the absorber pattern 4 is formed by dry etching or the like in a mask production process Thereafter, the intermediate layer is etched in conformity with the absorber pattern 4 to produce the intermediate layer pattern 3 illustrated in FIG. 1.

As the reflective multilayer film 2, use is made of a structure in which a plurality of kinds of materials different in refractive index for the wavelength of exposure light are periodically laminated by the thickness on the order of nanometers. In case where X-ray is used as a light source, the reflective multilayer film generally has a periodic multilayer structure comprising heavy elements such as Mo, Ru, and W and light elements such as Si and C. For the exposure light having a wavelength of, for example, about 13 nm, use may be made of the reflective multilayer film comprising a lamination of about 40 periods of Si films of 4 nm thick and Mo films of 3 nm thick.

Among the materials forming the reflective multilayer film, the heavy elements are susceptible to time variation in characteristics as a result of oxidization or the like. Taking this into account, a topmost layer of the reflective multilayer film generally comprises a light element such as Si. Japanese Unexamined Patent Publication No. H08-293450 (JP 8-293450 A) discloses a reflective-type mask addressed to the problem of the time variation in case where the heavy element is used as the topmost layer. In the reflective-type mask disclosed in the above-mentioned publication, an upper surface of the reflective multilayer film and the absorber film are covered with a coating layer made of a material small in time variation of optical constants.

However, the present inventors have found out that, even if the topmost layer of the reflective multilayer film comprises a light element such as Si or even if the heavy element is prevented from being exposed on the upper surface of the reflective multilayer film, the reflective multilayer film yet exhibits the time variation. Such time variation of the reflective multilayer film is a factor causing the decrease in reflectivity and in positional accuracy of the mask.

Furthermore, the present inventors found out that the time variation of the reflective multilayer film results from a damage through a side surface of the reflective multilayer film. Specifically, a peripheral end of a very thin layer of the heavy element is exposed at the side surface of the reflective multilayer film. The damage through the peripheral end causes variation in stress of the reflective multilayer film and time variation such as decrease in reflectivity.

SUMMARY OF THE INVENTION

It is therefore an object of this invention to prevent time variation of a reflective multilayer film.

It is another object of this invention to provide a reflective-type mask improved in reliability without deterioration in pattern transfer accuracy by preventing time variation of a reflective multilayer film.

It is still another object of this invention to provide a reflective-type mask blank for use in producing a reflective-type mask of the type.

As described above, the present inventors have found out that the time variation of the reflective multilayer film is caused also by the damage through the side surface thereof and that, by providing a protection layer on the side surface of the reflective multilayer film, the above-mentioned objects are achieved.

According to a first aspect of this invention, there is provided a reflective-type mask blank for exposure, comprising a substrate, a reflective multilayer film formed on the substrate for reflecting exposure light, and an absorber film formed on the reflective multilayer film for absorbing the exposure light, the reflective multilayer film comprising heavy element material films and light element material films different in refractive index from each other and alternately laminated, wherein:

the mask blank further comprises a protection layer for protecting peripheral ends of at least the heavy element material films in the reflective multilayer film.

According to a second aspect of this invention, there is provided a reflective-type mask blank for exposure according to the first aspect, wherein the protection layer comprises a thin film selected from a group of thin films same as the light element material films of the reflective multilayer film formed on the substrate and the absorber film formed on the reflective multilayer film and covers at least the peripheral ends of the heavy element material films.

According to a third aspect of this invention, there is provided a reflective-type mask blank for exposure according to the first aspect, wherein the protection layer is made of a material containing Si.

According to a fourth aspect of this invention, there is provided a reflective-type mask for exposure comprising a reflective-type mask blank according to any one of the first through the third aspects and a pattern formed on the absorber film of the reflective-type mask blank.

According to a fifth aspect of this invention, there is provided a method of producing a reflective-type mask blank for exposure, comprising the steps of forming on a substrate a reflective multilayer film which comprises heavy element material films and light element material films different in refractive index from each other and alternately laminated and which is adapted to reflect exposure light having a specific wavelength, and forming on the reflective multilayer film at least an absorber film for absorbing the exposure light, wherein:

at least one of a plurality of deposition steps each of which follows the deposition of each of the heavy element material films and deposits each of other films of the reflective multilayer film except the heavy element material films is selected as a selected deposition step;

a film material of at least one of the other films is deposited in the selected deposition step over a deposition area greater than a plan-view deposition area of each heavy element material film so that at least a peripheral portion of each heavy element material film is substantially entirely covered.

DESCRIPTION OF THE PREFERRED EMBODIMENTS

Figure 1:
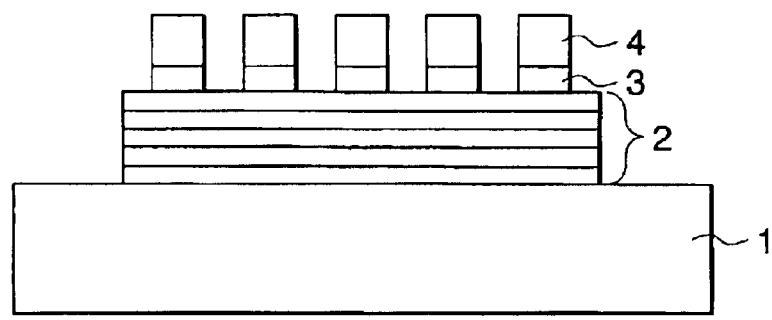
FIG. 1 is a sectional view of a conventional reflective-type mask.

Now, description will be made of a reflective-type mask blank and a reflective-type mask according to embodiments of this invention.

A reflective-type mask blank for exposure according to this invention comprises a substrate, a reflective multilayer film formed on the substrate for reflecting exposure light, and an absorber film formed on the reflective multilayer film for absorbing the exposure light. The reflective multilayer film comprises heavy element material films and light element material films different in refractive index from each other and alternately laminated. The mask blank further comprises a protection layer for protecting peripheral ends of at least the heavy element material films in the reflective multilayer film. The reflective-type mask blank of this invention can be produced by successively depositing, on the substrate, the reflective multilayer film and the absorber film by using sputtering or the like. The protection layer can be formed simultaneously when the reflective multilayer film is formed or after the reflective multilayer film is formed.

At first, the reflective multilayer film formed on the substrate will be described. The reflective multilayer film has a structure in which heavy element material films and light element material films different in refractive index from each other are alternately and periodically laminated. As a heavy element material, use is advantageously made of Mo, Ru, Rh, W, Ni, Cr, Nb, and the like. As a light element material, use is advantageously made of Si, Be, and the like. Generally, a layer relatively large in refractive index comprises a film of an element having a relatively large atomic number (i.e., a heavy element) or a film of a compound containing the heavy element. In the present specification, these films are collectively called the heave element material film. On the other hand, a layer relatively small in refractive index comprises a film of an element having a relatively small atomic number (i.e., a light element) or a film of a compound containing the light element. In the present specification, these films are collectively called the light element material film.

For example, if the exposure light has a wavelength of about 13 nm, use may be made of a Mo/Si reflective multilayer film which has a multilayer structure comprising a lamination of about 40 periods of alternate layers of Mo and Si. In case of the Mo/Si reflective multilayer film, the layer having a relatively large refractive index is Mo and the layer having a relatively small refractive index (nearer to 1) is Si.

The materials of the reflective multilayer films may appropriately be selected in dependence upon the wavelength of the exposure light. In a region of EUV light, use may be made of other various reflective multilayer films, for example, an Ru/Si periodic reflective multilayer film (Ru as a heavy element material film, Si as a light element material film), an Mo/Be periodic reflective multilayer film (Mo as a heavy element material film, Be as a light element material film), an Mo-compound/Si-compound periodic reflective multilayer film (Mo compound as a heavy element material film, Si compound as a light element material film), an Si/Nb periodic reflective multilayer film (Si as a light element material film, Nb as a heavy element material film), an Si/Mo/Ru periodic reflective multilayer film (Si as a light element material film, Mo/Ru as a composite heavy element material film), an Si/Mo/Ru/Mo periodic reflective multilayer film (Si as a light element material film, Mo/Ru/Mo as a composite heavy element material film), and an Si/Ru/Mo/Ru periodic reflective multilayer film (Si as a light element material film, Ru/Mo/Ru as a composite heavy element material film).

The reflective multilayer film may be formed on the substrate, for example, by DC magnetron sputtering. In case of the Mo/Si reflective multilayer film, sputtering may be carried out in an Ar gas atmosphere with a Si target and a Mo target alternately used to deposit 30 to 60 periods, preferably, 40 periods of alternate layers of Si and Mo. Finally, a Si film is deposited as a topmost layer. Alternatively, use may be made of IBD (Ion Beam Deposition).

Generally, a heavy element layer (heavy element material film) such as Mo is susceptible to deterioration such as oxidization. Taking this into account, a light element layer (light element material film) such as Si is formed as a topmost layer of the reflective multilayer film so as to suppress the deterioration. However, in case where an upper part of the reflective multilayer film is entirely coated with an intermediate layer or the like and is therefore unexposed, the layer relatively large in refractive index (heavy element layer), such as Mo, Ru, Rh, W, Ni, Cr, and Nb, may be selected among the layers forming the reflective multilayer film to be used as the topmost layer. Generally, as compared with the case where the light element layer is used as the topmost layer of the reflective multilayer film, the reflective multilayer film itself has an excellent reflectivity if the heavy element layer is used as the topmost layer of the reflective multilayer film. With this structure, the reflectivity can be improved. In case where the reflective multilayer film has a periodic structure of two or more elements or compounds, the layer having a largest refractive index may be used as the topmost layer.

Next, the protection layer in this invention will be described. The protection layer covers at least the peripheral ends of the heavy element material films of the reflective multilayer film. It is therefore possible to prevent time variation caused by a damage resulting from the contact between the side surface of the reflective multilayer film and outside air. The peripheral ends of the heavy element material films can be covered by the protection layer in different manners. Specifically, only the peripheral ends, which would otherwise be exposed, are covered. Alternatively, the heavy element material films are entirely covered.

As a material of the protection layer of this invention, use is preferably made of a material resistant against the exposure light and capable of preventing oxidization of the heavy element material films. More preferably, the material is excellent in resistance against a cleaning liquid used in a mask production process, free from reaction at the interface with the reflective multilayer film, and stable against moisture.

As far as the above-mentioned conditions are satisfied, the materials forming the reflective multilayer film and the materials used as the intermediate layer and the absorber film can be used as the protection layer. In this case, production of the protection layer is simplified.

Among the materials of the reflective multilayer film, a material containing Si and a material containing Be can be used as the material of the protection layer. As the materials containing Si and Be, use may be made of Si, Be, oxide thereof, nitride thereof, oxide nitride thereof, carbide thereof, and so on.

Among the materials of the absorber film, a material containing Ta as a main metal component, Ru, Rh, W, Au, and the like can be used as the material of the protection layer. Among the materials of the intermediate layer, a material containing Cr as a main metal component can be used as the material of the protection layer.

The protection layer must has a thickness adapted to prevent the reflective multilayer film from being damaged. Preferably, the protection layer has a thickness of about 10 nm or more. By the protection layer formed on the side surface of the reflective multilayer film, it is possible to prevent a damage resulting from oxidization through the side surface (peripheral end) of the reflective multilayer film and to effectively prevent time variation of characteristics of the reflective multilayer film.

By the protection layer formed on the side surface of the reflective multilayer film, it is also possible to prevent another damage through the side surface of the reflective multilayer film during a mask cleaning process. A chemical solution used in cleaning may be an acid solution such as hot strong sulfuric acid and a mixture of sulfuric acid and hydrogen peroxide solution or an alkali solution such as a mixture of ammonia and hydrogen peroxide solution.

Referring to FIGS. 2 through 7, description will be made of the structure and the formation of the protection layer in this invention in more detail.

1st Embodiment

Figure 2:
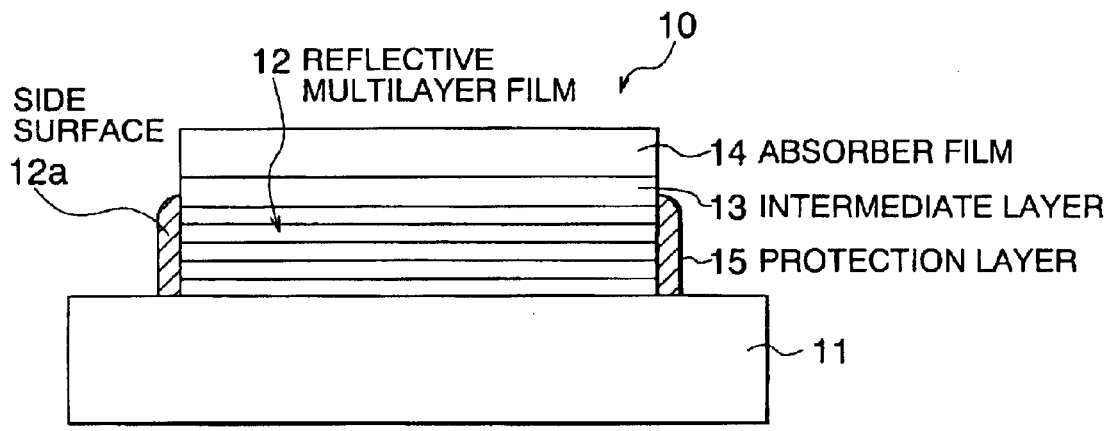
FIG. 2 is a sectional view of a first reflective-type mask blank according to this invention.

Referring to FIG. 2, a reflective-type mask blank depicted at 10 is produced in the manner known in the art by successively forming, on a substrate 11, a reflective multilayer film 12, an intermediate layer 13, and an absorber film 14. Thereafter, a protection layer 15 is formed on side surfaces 12a of the reflective multilayer film 12. Thus, the mask blank 10 with the protection layer 15 is produced. The protection layer 15 is formed throughout an entire area of the four side surfaces 12a (only two of them being illustrated) of the reflective multilayer film 12. As will readily be understood, the protection layer 15 may be formed not only on the side surfaces of the reflective multilayer film 12 but also on side surfaces of the intermediate layer 13 and the absorber film 14. The protection layer 15 is deposited in the following manner. A deposition material blocking mask is formed on the mask blank 10 in an area, such as an upper surface of the mask blank 10, except the side surfaces 12a of the reflective multilayer film 12. Then, metal, resin, glass, or the like is deposited by sputtering. If resin is used, the protection layer 15 may be formed by spraying, dipping, or applying. The protection layer 15 may be formed after a mask is produced from the mask blank 10.

2nd Embodiment

Figure 3:
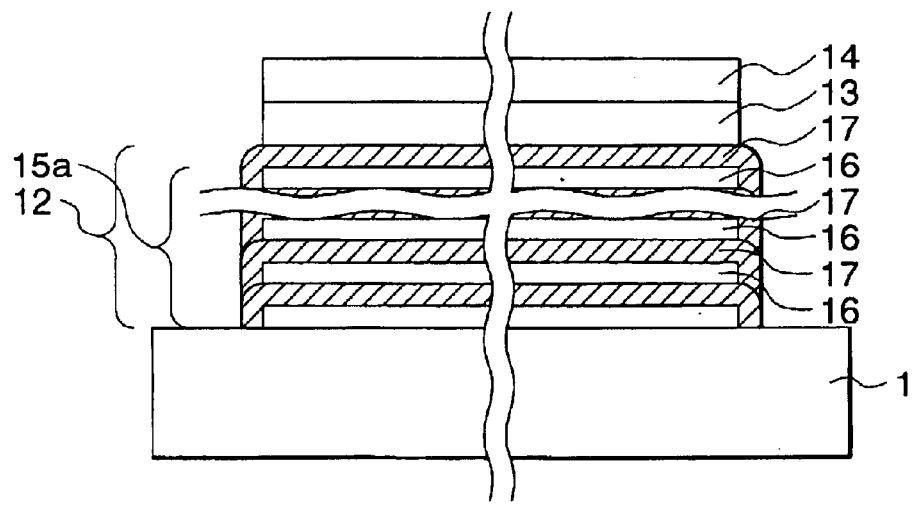
FIG. 3 is a sectional view of a second reflective-type mask blank according to this invention.
Figure 4:
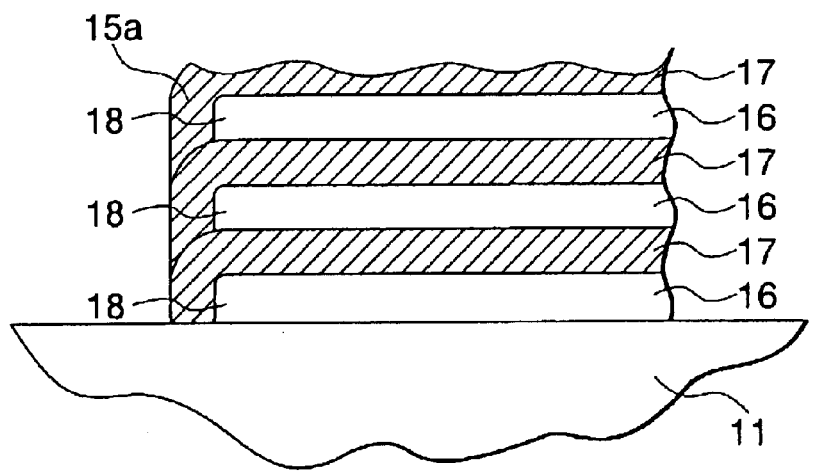
FIG. 4 is an enlarged view of a peripheral end of a reflective multilayer film illustrated in FIG. 3.

Referring to FIGS. 3 and 4, a heavy element material film 16 of the reflective multilayer film 12 is formed on the substrate 11 and, thereafter, a light element material film 17 is formed to entirely cover the heavy element material film 16. Coverage by the light element material film 17 is realized by depositing the light element material film 17 in a wider deposition area greater than a plan-view deposition area of the heavy element material film 16, i.e., in an area enlarged outward by 1 mm or more with respect to the plan-view deposition area of the reflective multilayer film 12. A deposition step of depositing a pair of the heavy element material film 16 and the light element material film 17 is repeated a plurality of times. As a consequence, the reflective multilayer film 12 with peripheral ends 18 of the heavy element material films 16 covered with the light element material films 17 is obtained. In this case, peripheral portions of the light element material films 16 are continuously laminated at the peripheral ends of the reflective multilayer film 12 to serve as a protection layer 15a.

In order to form the protection layer of the light element material, it is not essential to increase the deposition area each time when the light element material film is deposited. As far as the peripheral ends of the heavy element material films are sufficiently covered, deposition over the wider deposition area may be carried out only when specific and selected ones of the light element material films are deposited. If the light element material film of the reflective multilayer film has a multilayer structure including a plurality of layers different in material, the protection layer may comprise one of the layers or all of the layers.

3rd Embodiment

Figure 5:
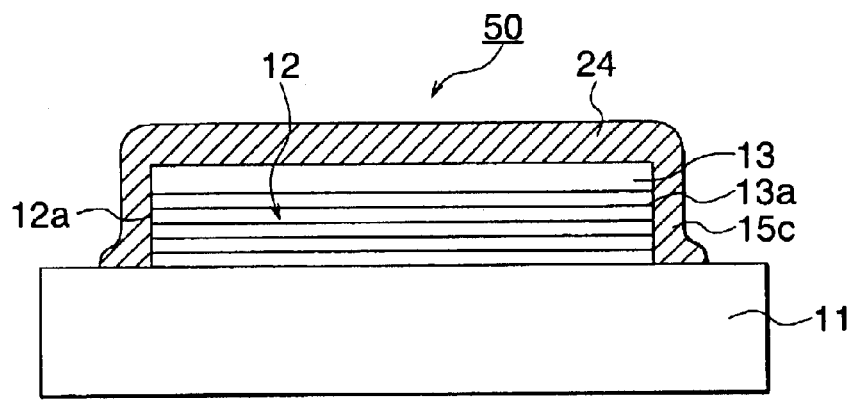
FIG. 5 is a sectional view of a third reflective-type mask blank according to this invention.

Referring to FIG. 5, the reflective multilayer film 12 and the intermediate layer 13 are formed on the substrate 11 in the manner known in the art. Thereafter, an absorber film 24 is formed so that the peripheral ends of the heavy element material films are covered. Specifically, the absorber film 24 is deposited on an upper surface of the intermediate layer 13, side surfaces 13a of the intermediate layer 13, and the side surfaces 12a of the reflective multilayer film 12. The absorber film 24 can be realized by depositing the absorber film 24 in a wider deposition area greater than the deposition area of the reflective multilayer film 12, i.e., in an area enlarged outward by 1 mm or more with respect to the deposition area of the reflective multilayer film 12. In this case, side surface portions 15c of the absorber film 24 are formed on the side surfaces 12a of the reflective multilayer film 12 to serve as a protection layer. In case where the absorber film includes a plurality of layers different in material, the protection layer may be formed by one of the materials of the absorber film. Alternatively, the protection layer may have a multilayer structure formed by the respective layers of the different materials.

4th Embodiment

Figure 6:
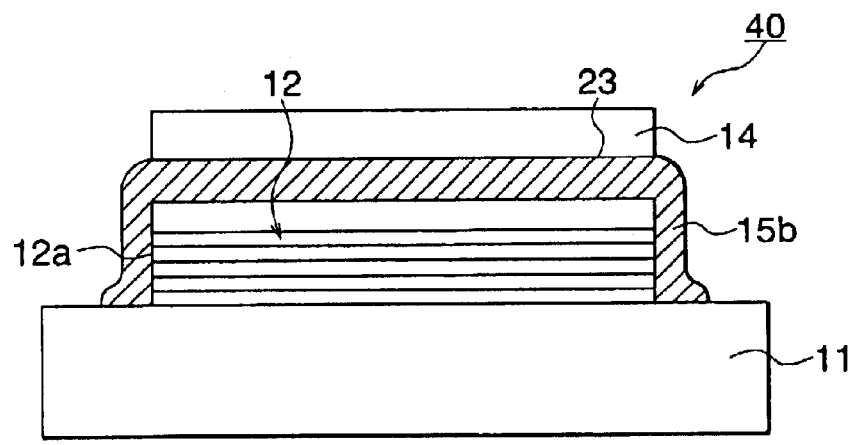
FIG. 6 is a sectional view of a fourth reflective-type mask blank according to this invention.

Referring to FIG. 6, the reflective multilayer film 12 is formed on the substrate 11 in the manner known in the art. An intermediate layer 23 is formed in the manner similar to that mentioned above in conjunction with the protection layer formed by the absorber film. Specifically, the intermediate layer 23 is deposited to cover the upper surface of the reflective multilayer film 12 and the side surfaces 12a of the reflective multilayer film 12. In this case, side surface portions 15b of the intermediate layer 23 serve as a protection layer. Preferably, the intermediate layer 23 is made of a material which is not only resistant against a mask cleaning liquid and against environment but also low in stress and which has a roughness of 0.5 nmRms or less, more preferably 0.5 nmRms or less. In this respect, the intermediate layer 23 preferably has a fine crystal structure or an amorphous structure. In case where the intermediate layer includes a plurality of layers different in material, the protection layer may be formed by one of the materials of the intermediate layer. Alternatively, the protection layer may have a multilayer structure formed by the respective layers of the different materials.

In the foregoing, description has been made of the embodiment (first) in which the protection layer is formed without using the materials of the mask and the embodiments (2nd through 4th) in which the protection layer is formed by the use of the thin films of the mask. It will readily be understood that the first through the fourth embodiments may appropriately be combined. According to the second through the fourth embodiments, an additional step of forming the protection layer is not required. Merely by enlarging the deposition area upon deposition of the thin films of the mask, the protection layer can easily be formed on the side surfaces of the reflective multilayer film. Furthermore, in the cleaning step subsequently carried out, the heavy element material films of the reflective multilayer film are protected.

As described above, the reflective-type mask blanks 10, 30, 40, and 50 with the protection layer formed on the side surfaces of the reflective multilayer film are obtained. In the embodiments in which the intermediate layer is not used as the protection layer, the intermediate layer 13 exclusively serves to prevent the reflective multilayer film from being damaged during etching of the absorber film. However, the intermediate layer of the type is not essential if any other means (for example, selection of the material) for preventing the reflective multilayer film from being damaged during etching of the absorber film is provided. Depending upon the purpose, various types of intermediate layers may appropriately be formed.

Next, description will be made of production of the reflective-type mask according to this invention by the use of the reflective-type mask blank 10 illustrated in FIG. 2.

Figure 7:
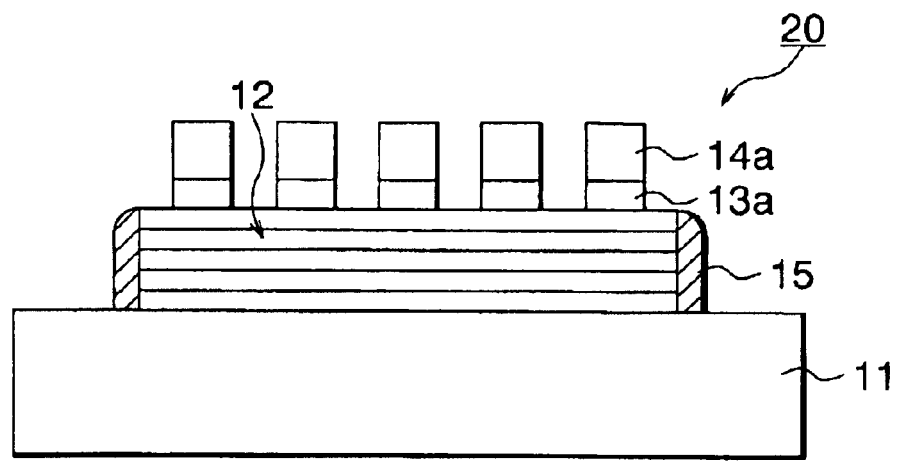
FIG. 7 is a sectional view of a reflective-type mask formed by the first reflective-type mask blank illustrated in FIG. 2.

Referring to FIG. 7, the reflective-type mask depicted by 20 can be produced by forming a transfer pattern on each of the absorber film 14 and the intermediate layer 13 of the reflective-type mask blank 10 illustrated in FIG. 2. The transfer pattern on the absorber film 14 is formed by depositing an EB resist layer on the absorber film 14 of the reflective-type mask blank 10, forming a resist pattern by EB writing, and etching the absorber film 14 by dry etching or the like with the resist pattern used as a mask. After an absorber pattern 14a is formed, the intermediate layer 13 is patterned in conformity with the absorber pattern 14a to form an intermediate layer pattern 13a. In this manner, the reflective-type mask 20 of this invention is obtained.

As described above, each of the reflective-type mask blank and the reflective-type mask according to this invention is prevented from damage such as oxidization through the side surfaces of the reflective multilayer film because the protection layer is formed on the side surfaces of the reflective multilayer film.

The reflective-type mask and the reflective-type mask blank of this invention are based on the assumption that the above-mentioned EUV light having a wavelength of about 0.2 to 100 nm is used as the exposure light. However, the reflective-type mask and the reflective-type mask blank of this invention may appropriately be used for light having a different wavelength.

EXAMPLES

Specific examples of this invention will be described in detail.

1st Example

Protection Layer by the Use of Material of Reflective Multilayer Film

The reflective-type mask blank 30 illustrated in FIG. 3 was produced as follows. At first, the substrate 11 was prepared. The substrate 11 was a $SiO_2$—$TiO_2$-based glass substrate having an outer dimension of 6-inch square and a thickness of 6.3 mm. The glass substrate 11 had a thermal expansion coefficient of $0.2 \times 10^{-7}/°$ C. and a Young's modulus of 67 GPa. The glass substrate was subjected to mechanical polishing to have a roughness of 0.12 nmRms and a flatness of 100 nm or less.

Next, the reflective multilayer film 12 was formed on the glass substrate 11. As the reflective multilayer film 12 formed on the substrate 11, use was made of a Mo/Si periodic reflective multilayer film adapted to exposure light in a wavelength band of 13–14 nm. Herein, Mo and Si are a heavy element material and a light element material, respectively. The Mo/Si periodic reflective multilayer film was deposited on the substrate 11 by DC magnetron sputtering in the following manner.

At first, a Si film was deposited to the thickness of 4.2 nm by the use of a Si target in an Ar gas atmosphere kept at a pressure of 0.1 Pa. Then, a Mo film was deposited to the thickness of 2.8 nm by the use of a Mo target in an Ar gas atmosphere kept at a pressure of 0.1 Pa. The above-mentioned deposition of the single Si film and the single Mo film is defined as a single period. After deposition of 40 periods, another Si film was finally deposited. The total film thickness was 284 nm. Upon deposition, the deposition area of Mo was 146×146 mm. Upon deposition of Si, the deposition area was enlarged to 148×148 mm. As a consequence, the side surfaces of the reflective multilayer film were coated when the Si films were formed. Thus, the protection layer 15a of Si having a thickness of about 10 nm or more was formed on the side surface of the reflective multilayer film. For the reflective multilayer film 12, the reflectivity was measured with respect to the light having a wavelength of 13.4 nm and an incident angle of 2°. As a result, the reflectivity was equal to 65%.

Next, on the reflective multilayer film 12, a CrN film was deposited to a thickness of 10 nm as the intermediate layer 13. Deposition was carried out by DC magnetron sputtering using a Cr target and a sputter gas containing Ar with 20% $N_2$ added thereto. It was confirmed by the X-ray diffraction analysis that the deposited film had a composition of $Cr_{1-x}N_x$ where x was equal to 0.1 and a Cr-base fine crystal structure. The intermediate layer 13 formed on the reflective multilayer film 12 has a function as an etch stopper layer for protecting the reflective multilayer film 12 when the transfer pattern is formed on the absorber film 14.

Next, a Ta4B film as the absorber film 14 was deposited on the intermediate layer 13 to a thickness of 70 nm. Deposition was carried out by DC magnetron sputtering using a Ta4B sintered target and an Ar gas as a sputter gas under the condition of a sputter gas pressure of 0.2 Pa and a supply power of 2 kW given to the target. The absorber film 14 formed as mentioned above had a composition ratio substantially identical with that of the target and an amorphous structure. Thus, the reflective-type mask blank 30 illustrated in FIG. 3 was obtained.

Next, by the use of the reflective-type mask blank 30, the reflective-type mask 20 illustrated in FIG. 7 was produced. The reflective-type mask 20 has a pattern for a 16 Gbit-DRAM having a design rule of 0.07 µm. At first, an EB (Electron Beam irradiation) resist was applied onto the absorber film 14 of the above-mentioned reflective-type mask blank 30. A resist pattern was formed by EB writing and development. With the resist pattern as a mask, the absorber film 14 was dry-etched by ICP etching (Inductively Coupled Plasma etching) using chlorine to form the absorber pattern on the absorber film 14. The dry etching was carried out under the condition of a gas pressure of 0.1 Pa, a substrate temperature of 20° C., and an RF bias of 100 W. The CrN film as the intermediate layer 13 was exposed to the etching gas as a result of over-etching. However, the reduction in thickness was on the order of 1 nm.

Furthermore, the CrN intermediate layer 13 remaining in an area where the absorber film 14 was removed was dry etched by the use of a mixed gas of chlorine and oxygen and partially removed in conformity with the absorber pattern 14a. Next, the resist pattern remaining on the absorber pattern 14a was removed by the use of a hot sulfuric acid at 100° C. Thus, the reflective-type mask 20 in this example was obtained. By the use of the reflective-type mask 20, the reflectivity was measured with respect to the EUV light having a wavelength of 13.4 nm and an incident angle of 2°. As a result, the reflectivity was equal to 64%.

Figure 8:
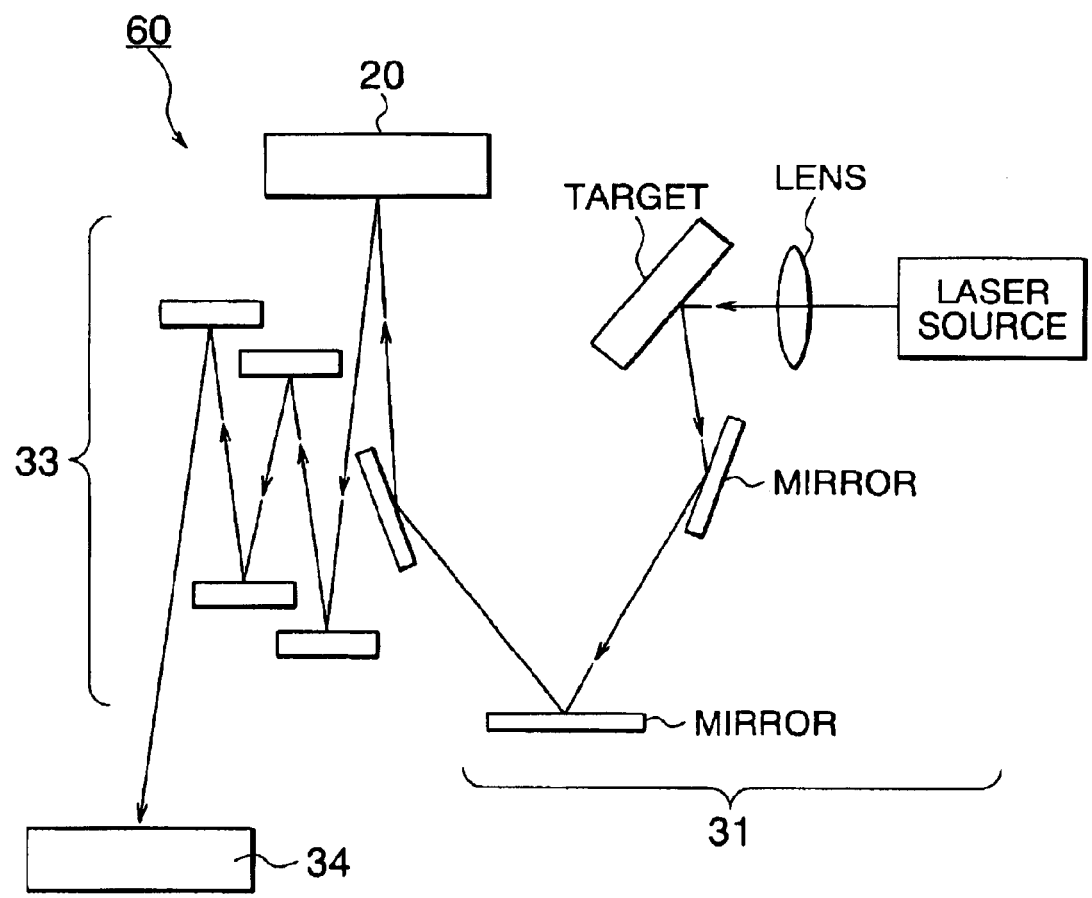
FIG. 8 is a view for describing a method of transferring a pattern onto a semiconductor substrate by the use of the reflective-type mask.

Next referring to FIG. 8, description will be made of a method of transferring a pattern on a semiconductor substrate 34 with a resist by the use of the reflective-type mask 20 and the EUV light. A pattern transfer apparatus 60 generally comprises a laser plasma X-ray source 31, the reflective-type mask 20, and a reducing optical system 33. As the reducing optical system 33, an X-ray reflection mirror may be used. While the light reflected by the reflective-type mask 20 passes through the reducing optical system 33, the pattern is typically reduced to about ¼. Since the wavelength band of 13–14 nm is used as the exposure wavelength, the apparatus is arranged so that an optical path is positioned in vacuum. In the above-mentioned condition, the EUV light emitted from the laser plasma X-ray source 31 is incident to the reflective-type mask 20. The light reflected by the reflective-type mask 20 passes through the reducing optical system 33 and is directed to the Si wafer 34 to transfer the pattern.

The light incident to the reflective-type mask 20 in an absorption region where the absorber pattern is present is absorbed by the absorber film and is not reflected. On the other hand, the light incident in a reflection region where the absorber film is not formed is reflected by the reflective multilayer film. The light reflected by the reflective-type mask 20 and forming an image of the pattern is incident to the reducing optical system 33. Then, the light is directed to the resist layer formed on the Si wafer 34. In this manner, the pattern is transferred to the resist layer by exposure. By development, a resist pattern is obtained. By the above-mentioned pattern transfer onto the semiconductor substrate, the reflective-type mask in this example is expected to have an accuracy which does not exceed 16 nm as required in the 70 nm design rule.

In order to examine time variation of reflection characteristics as a result of deterioration of the reflective multilayer film, the reflective-type mask in this example was held in atmospheric air for 100 days. Thereafter, the reflectivity was measured again. The reflective-type mask in this example did not exhibit decrease in reflectivity even after lapse of 100 days.

In order to examine the resistance against the mask cleaning liquid, the reflective-type mask in this example was dipped in a mixture of sulfuric acid and hydrogen peroxide solution used as the mask cleaning liquid at 100° C. for 30 minutes. After dipping, the reflective-type mask had a reflectivity of 64%. Thus, no decrease in reflectivity was observed.

2nd Example

Protection Layer by the Use of Material of Intermediate Layer

Description will be made of a specific example of the reflective-type mask blank 40 illustrated in FIG. 6. In this example, the deposition area of the intermediate layer 23 was widened without changing the deposition area of the reflective multilayer film 12 so that the protection layer 15b made of the material of the intermediate layer 23 was formed on the side surfaces of the reflective multilayer film 12. The substrate 11 and the absorber film 14 in this example are same as those in the first example.

At first, an Mo/Si periodic multilayer film as the reflective multilayer film 12 was formed on the substrate 11 in the manner similar to the first example. The deposition area was 146×146 mm for both of an Mo layer and an Si layer. For the reflective multilayer film 12, the reflectivity was measured with respect to the light having a wavelength of 13.4 nm and an incident angle of 2°. As a result, the reflectivity was 65%.

Next, on the reflective multilayer film 12, a CrN film was deposited to a thickness of 10 nm as the intermediate layer 23 in the manner similar to the first example. Herein, the deposition area was 150×150 mm which was greater than the area where the reflective multilayer film was formed. By widening the deposition area as mentioned above, the side surfaces of the reflective multilayer film 12 were coated with the material same as that of the intermediate layer 23. Thus, the protection layer 15b was formed on the side surfaces of the reflective multilayer film 12. The protection layer 15b had a thickness of about 10 nm.

Furthermore, the absorber film 14 of Ta4B was deposited on the intermediate layer 23 in the manner similar to the first example. Thus, the reflective-type mask blank 40 illustrated in FIG. 6 was obtained.

Next, in the manner similar to the first example, pattern formation of the absorber film 14 and removal of the intermediate layer 23 were carried out to obtain the reflective-type mask in this example. By the use of the reflective-type mask, the reflectivity was measured with respect to the EUV light having a wavelength of 13.4 nm and an incident angle of 2°. As a result, the reflectivity was equal to 64%.

If pattern transfer onto the semiconductor substrate illustrated in FIG. 5 is carried out in the manner similar to the first example, it is expected that the reflective-type mask in this example would have an accuracy which does not exceed 16 nm as required in the 70 nm design rule.

In the manner similar to the first example, the reflective-type mask in this example was held in atmospheric air for 100 days. Thereafter, the reflectivity was measured again. As a result, no decrease in reflectivity was observed.

Under the condition similar to the first example, the reflective-type mask in this example was dipped in the mask cleaning liquid. After dipping, the reflective-type mask had a reflectivity of 64%. Thus, no decrease in reflectivity was observed.

3rd Example

Protection Layer by the Use of Material of Absorber Film

In the third example, the deposition area was widened upon deposition of the absorber film 24 as illustrated in FIG. 5. Simultaneously when the absorber film 24 was formed, the protection layer 15c made of the material of the absorber film 24 was formed on the side surfaces of the reflective multilayer film 12. The substrate 11 and the reflective multilayer film 12 in this example are same as those in the second example. At first, on the reflective multilayer film 12 formed on the substrate 11, a CrN intermediate layer 13 was deposited to a thickness of 10 nm in the manner similar to the first example.

Next, on the intermediate layer 13, the Ta4B absorber film was deposited to 70 nm in the manner similar to the first example. Herein, the deposition area was 150×150 mm which was wider than 146×146 mm as the deposition area of each of the reflective multilayer film 12 and the intermediate layer 13. As a consequence, the protection layer 15c made of a material containing Ta and B was formed on the side surfaces of the reflective multilayer film 12. The protection layer 15c had a thickness of about 70 nm. In the above-mentioned manner, the reflective-type mask blank illustrated in FIG. 5 was obtained.

Next, in the manner similar to the first example, pattern formation of the absorber film 24 and removal of the intermediate layer 13 were carried out to obtain the reflective-type mask in this example. By the use of the reflective-type mask, the reflectivity was measured with respect to the EUV light having a wavelength of 13.4 nm and an incident angle of 2°. As a result, the reflectivity was equal to 64%.

If pattern transfer onto the semiconductor substrate illustrated in FIG. 5 is carried out in the manner similar to the first and the second examples, it is expected that the reflective-type mask in this example would have an accuracy which does not exceed 16 nm as required in the 70 nm design rule.

In the manner similar to the first and the second examples, the reflective-type mask in this example was held in atmospheric air for 100 days. Thereafter, the reflectivity was measured again. As a result, no decrease in reflectivity was observed.

Under the condition similar to the first example, the reflective-type mask in this example was dipped in the mask cleaning liquid. After dipping, the reflective-type mask had a reflectivity of 64%. Thus, no decrease in reflectivity was observed.

4th Example

Protection Layer by the Use of other Material

As the reflective multilayer film 12 formed on the substrate 11, the Mo/Si periodic multilayer film adapted to the exposure light in the wavelength band of 13–14 nm was formed. By successively forming the CrN intermediate layer and the Ta absorber film, the reflective-type mask blank was completed.

Next, the mask blank was covered with a mask except the side surfaces 12a, applied with Teflon resin ("Teflon" is the trademark for polytetrafluoroethylene), and dried. Thus, the protection layer 15 was formed. In the manner similar to the first example, the reflective-type mask in this example was held in atmospheric air for 100 days. Thereafter, the reflectivity was measured again. As a result, no decrease in reflectivity was observed.

Comparative Example

The comparative example is different from the first through the fourth examples in that no protection layer is formed on the side surfaces of the reflective multilayer film. A reflective-type mask blank and a reflective-type mask in the comparative example were produced in the manner similar to the first example. However, the reflective multilayer film was formed without widening the deposition area when the Si layers of the reflective multilayer film were formed. As a result, no protection layer was formed on the side surfaces of the reflective multilayer film. By the use of the reflective-type mask, the reflectivity was measured with respect to the EUV light having a wavelength of 13.4 nm and an incident angle of 2°. As a result, the reflectivity was equal to 64% which is equivalent to that in each of the first through the third examples.

After the reflective-type mask in the comparative example was held in atmospheric air for 100 days, the reflectivity was measured again. As a result, the reflectivity was decreased to 58%. Under the condition similar to the first example, the reflective-type mask in the comparative example was dipped in the mask cleaning liquid. After dipping, the reflectivity of the reflective-type mask was measured. As a result, the reflectivity was decreased to 50%.

Other Modifications of this Invention

In the foregoing examples, the $SiO_2$—$TiO_2$ glass was used as the substrate 11. As other glass materials, use may be made of a silica glass or a crystallized glass containing β-quartz solid solution deposited therein. As a metal material, use may be made of an Invar alloy (Fe—Ni alloy).

In the examples, CrN was used as the intermediate layer. It is noted here that the intermediate layer may be made of a material containing Cr alone or a material containing Cr and at least one element selected from the group consisting of N, O, and C.

For example, use may be made of $Cr_{1-x}N_x$ (preferably, $0.05 \leq x \leq 0.5$), $Cr_{1-x}O_x$ (preferably, $0.05 \leq x \leq 0.6$), $Cr_{1-x}C_x$ (preferably, $0.05 \leq x \leq 0.4$), $Cr_{1-x-y}N_xC_y$ (preferably, $0.05 \leq x \leq 0.45$, $0.01 \leq y \leq 0.3$), and $Cr_{1-x-y-z}N_xO_yC_z$ (preferably, $0.05 \leq x \leq 0.40$, $0.02 \leq y \leq 0.3$, $0.01 \leq z \leq 0.2$). As other materials except those containing Cr as a main metal component, use may be made of a film containing Ru, a film containing Rh, and a film containing Ti. In the examples, CrN in the reflection region was removed. However, CrN may not be removed if the CrN intermediate layer 13 is as thin as 3 to 10 nm.

Besides the DC sputtering and the RF sputtering, the intermediate layer 13 may be formed on the reflective multilayer film 12 by other sputtering techniques, such as ion beam sputtering.

In the examples, Ta4B was used as the absorber film. Alternatively, use may be made of other materials containing Ta as a main component, for example, a material containing Ta alone, a material containing Ta and N, a material containing Ta, B, and O or N, a material containing Ta and Si, a material containing Ta, Si, and N, a material containing Ta and Ge, and a material containing Ta, Ge, and N. By addition of B, Si, or Ge to Ta, a material having an amorphous structure can easily be obtained so that the smoothness is improved. If N or O is added to Ta, the resistance against oxidization is improved so that time stability is improved. As materials other than those containing Ta as a main component, $SiO_2$, C, Ru, SiON, $Al_2O_3$, WN, TiN, and so on may be used as the absorber film in this invention.

As described above, according to this invention, the damage through the side surfaces of the reflective multilayer film is prevented. It is therefore possible to obtain the reflective-type mask improved in reliability by preventing the time variation of the reflective multilayer film and to obtain the reflective-type mask blank for use in producing the reflective-type mask.

What is claimed is:

1. A reflective-type mask blank for exposure, comprising:
   a substrate,
   a reflective multilayer film formed on the substrate for reflecting exposure light, the reflective multilayer film comprising heavy element material films and light element material films different in refractive index from each other and alternately laminated,
   an absorber film formed on the reflective multilayer film for absorbing the exposure light, and
   a protection layer for covering a side surface in which at least the heavy element material films in the reflective multilayer film are exposed.

2. A reflective-type mask blank for exposure according to claim 1, wherein:
   the protection layer comprises a thin film selected from a group of thin films same as the light element material films of the reflective multilayer film formed on the substrate, the absorber film formed on the reflective multilayer film, and an intermediate layer formed between the reflective multilayer film and the absorber film.

3. A reflective-type mask blank for exposure according to claim 1, wherein:
   the protection layer is made of a material containing Si.

4. A reflective-type mask for exposure comprising a reflective-type mask blank according to any one of claims 1 through 3 and a pattern formed on the absorber film of the reflective-type mask blank.

5. A method of producing a reflective-type mask blank for exposure, comprising the steps of:
   forming a reflective multilayer film on a substrate, the reflective multilayer film comprising heavy element material films and light element material films different in refractive index from each other and alternately laminated and being adapted to reflect exposure light having a specific wavelength; and
   forming at least an absorber film for absorbing the exposure light on the reflective multilayer film;
   wherein at least one of a plurality of deposition steps each of which follows the deposition of each of the heavy element material films and deposits another film except the heavy element material films, the another film is deposited over a deposition area greater than a plan-view deposition area of the heavy element material film so as to cover a side surface in which the heavy element material films are exposed.

6. A method according to claim 5, wherein:
   the other film is the light element material film of the reflective multilayer film.

7. A method according to claim 5, wherein:
   the other film is absorber film.

8. A method according to claim 5, wherein:
   the other film is an intermediate layer between the reflective multilayer film and the absorber film.

9. A reflective-type mask blank for exposure according to claim 1, wherein:
   the heavy element material film is at least one selected from the group consisting of Mo, Ru, Rh, W, Ni, Cr, and Nb.

10. A method according to claim 5, wherein:
    the heavy element material film is at least one selected from the group consisting of Mo, Ru, Rh, W, Ni, Cr, and Nb.

* * * * *